(12) United States Patent
Terada et al.

(10) Patent No.: US 8,410,457 B2
(45) Date of Patent: Apr. 2, 2013

(54) SAMPLE TRANSFER DEVICE AND SAMPLE TRANSFERRING METHOD

(75) Inventors: Shohei Terada, Hitachinaka (JP);
Tatsumi Hirano, Hitachinaka (JP);
Koichi Watanabe, Hitachi (JP);
Yasuichiro Watanabe, Mito (JP);
Hiromitsu Seino, Iwaki (JP)

(73) Assignee: Hitachi, Ltd., Tokyo (JP)

( * ) Notice: Subject to any disclaimer, the term of this patent is extended or adjusted under 35 U.S.C. 154(b) by 73 days.

(21) Appl. No.: 13/015,115

(22) Filed: Jan. 27, 2011

(65) Prior Publication Data
US 2011/0180724 A1 Jul. 28, 2011

(30) Foreign Application Priority Data
Jan. 28, 2010 (JP) .................... 2010-016146

(51) Int. Cl.
*G01N 21/00* (2006.01)
(52) U.S. Cl. .............. 250/491.1; 250/311; 250/526
(58) Field of Classification Search .............. None
See application file for complete search history.

(56) References Cited

U.S. PATENT DOCUMENTS

| | | | | |
|---|---|---|---|---|
| 5,164,974 A * | 11/1992 | Kariya et al. | | 378/34 |
| 5,581,088 A * | 12/1996 | Kasai | | 250/440.11 |
| 5,674,368 A * | 10/1997 | Hashimoto et al. | | 204/298.25 |
| 6,320,195 B1 * | 11/2001 | Magome | | 250/442.11 |
| 6,897,443 B2 * | 5/2005 | Gross | | 850/9 |
| 7,717,966 B2 * | 5/2010 | Watson | | 29/25.01 |
| 7,979,157 B2 * | 7/2011 | Anvari | | 700/245 |
| 2001/0023522 A1 * | 9/2001 | Watson et al. | | 29/25.01 |
| 2002/0122879 A1 * | 9/2002 | Kawamura | | 427/10 |
| 2003/0090666 A1 * | 5/2003 | Kaufmann | | 356/438 |
| 2004/0238739 A1 * | 12/2004 | Gross | | 250/310 |
| 2006/0027763 A1 * | 2/2006 | Deak | | 250/492.21 |
| 2009/0059190 A1 * | 3/2009 | Tanaka et al. | | 355/30 |
| 2009/0200268 A1 * | 8/2009 | Tappan et al. | | 216/67 |
| 2010/0096549 A1 * | 4/2010 | Nishiyama | | 250/307 |

FOREIGN PATENT DOCUMENTS

| | | | |
|---|---|---|---|
| EP | 1671738 A2 * | 6/2006 | |
| JP | 60-264033 | 12/1985 | |
| JP | 63-287032 | 11/1988 | |
| JP | 2009278002 A * | 11/2006 | |
| JP | 2009-080005 | 4/2009 | |

OTHER PUBLICATIONS

Chihiro Kaito et al., "Structural Alteration of Nanostructure Carbon Particles Carrying Pt Clusters in H2 and O2 Gases," Japanese Journal of Applied Physics, vol. 46, No. 46, 2007, pp. L1141-L1142.

* cited by examiner

*Primary Examiner* — David A Vanore
*Assistant Examiner* — Andrew Smyth
(74) *Attorney, Agent, or Firm* — McDermott Will & Emery LLP

(57) ABSTRACT

A sample transfer device is provided which can insert to a charged particle beam apparatus a sample to be observed and analyzed under irradiation of a charged particle beam while suppressing to a minimum the time to expose the sample to the atmospheric environment. The sample transfer device for transferring the sample to be observed and analyzed by irradiating the charged particle beam comprises an expansible hollow member capable of accommodating a sample holder mounting the sample, a fixing member for fixing the sample holder within the expansible hollow member, and a sealing member communicating with the interior of the expansible hollow member to open/close an opening through which the sample holder passes.

16 Claims, 8 Drawing Sheets

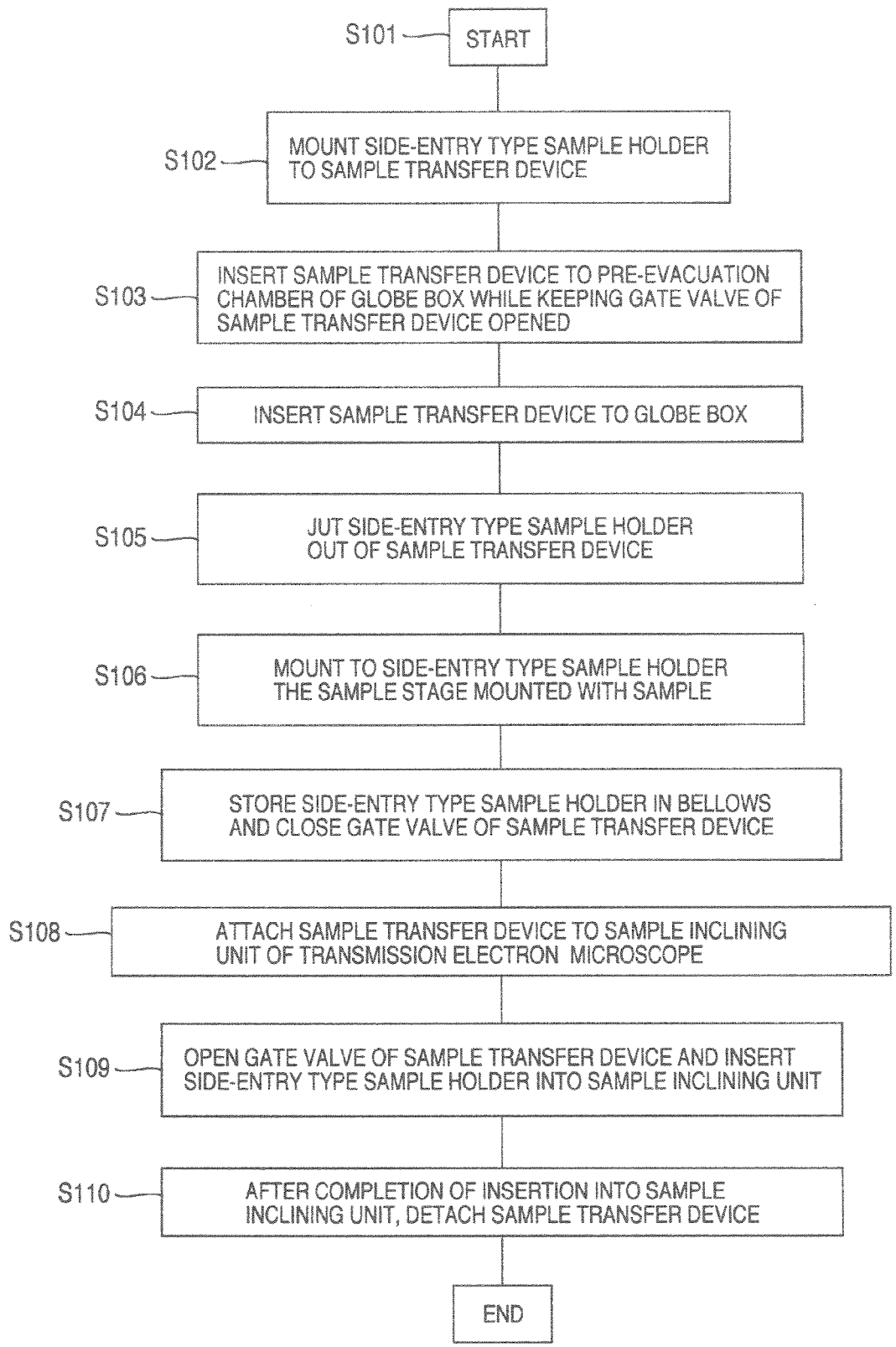

SAMPLE TRANSFER DEVICE AND SAMPLE TRANSFERRING METHOD

BACKGROUND OF THE INVENTION

The present invention relates to a sample transfer device for a transmission electron microscope, a scanning transmission electron microscope and the like and more particularly, to a sample transfer device which can insert a sample into the transmission electron microscope or scanning transmission electron microscope while suppressing to a minimum the time to expose the sample to the atmospheric environment.

With processing critical dimensions of a semiconductor device, a magnetic device and the like reduced minutely and with high integration advanced, degradation in device characteristics and decrease in reliability have been bringing about more important problems than before. In recent years, in order to analyze defects of semiconductor device in a nanometer region and ascertain causes of defects thoroughly to solve them in the course of development of new processes and mass-production, spectral analysis and two-dimensional element distribution analysis using (scanning) transmission electron microscopy ((S) TEM) and electron energy loss spectroscopy (EELS) have become indispensable analysis means.

Further, in connection with an energy environmental material such as a material of a positive pole of Li battery, improvements in material characteristics have been desired to make more rapid progress than before. For the purpose of improving the material characteristics, controlling of structures and chemical bond status at nano-level holds important key. Therefore, needs for the aforementioned analytical technologies have been increasing.

Conventionally, a sample or specimen for transmission electron microscopy or scanning transmission microscopy is fixed to a sample stage for transmission electron microscope called a sample mesh. The manner of fixing the sample differs depending on the shape of the sample and the observing field of the sample. For example, in the case of particles of nanometer size, the particles are scattered directly to the sample stage in a sample preparation chamber such as a globe box, for instance, filled with argon gas. Further, when a portion determined faulty in electrical characteristics or the like in a semiconductor device or magnetic device is desired to be observed, a region inclusive of an observing objective and its neighborhood is extracted by means of a focused ion beam (FIB) apparatus and is fixed to the sample stage by using tungsten gas.

Then, after the sample to be observed in the transmission electron microscope has been fixed to the sample stage, the sample stage is mounted on a sample holder for transmission electron microscope and in general, the sample holder per se mounting the sample stage is transferred in atmospheric environment and is then inserted into the transmission electron microscope. The sample holder is mainly classified into a top-end type sample holder and a side-entry type sample holder but in recent years, the side-entry type sample holder is the prevalent mainly.

In the above case, the sample holder is transferred in atmospheric environment from a sample preparation room or the focused ion beam apparatus to the transmission electron microscope. Accordingly, when a sample to be measured is easy to react with water content or oxygen, there is a possibility that the sample will be changed in quality or its oxidization will proceed, thus making desired observation and element analysis difficult. Conventionally, techniques have been disclosed in which a measurement sample of an electron microscope as typified by the transmission electron microscope is inserted into the electron microscope while suppressing to a minimum the time to expose the sample to the atmospheric environment.

More particularly, one may refer to the following documents:
PATENT DOCUMENT 1: JP-A-60-264033
PATENT DOCUMENT 2: JP-A-2009-80005
PATENT DOCUMENT 3: JP-A-63-287032
NON-PATENT DOCUMENT 1: Japanese Journal of Applied Physics Vol. 46, pages L1141 to L1142

Patent Document 1 discloses an ambience sample chamber detachably attached to a sample inclining unit for electron microscope so that a side-entry type sample holder may be mountable/dismountable into/from the ambience sample chamber and also discloses a member for supporting the sample holder for use in the ambience sample chamber for electron microscope, which support member facilitates taking-in and out operation of the sample holder to the sample inclining unit.

Non-patent Document 1 discloses a technique according to which a side-entry type sample holder mountable to the transmission electron microscope sample stage is provided with, at its tip end, an O-ring and a sleeve and when transferring the side-entry type sample holder in the atmospheric environment, a neighborhood of the sample stage is covered with the sleeve, the sample stage having its neighborhood kept to be covered with the tip end sleeve is inserted into the transmission electron microscope and after completion of insertion, the tip end sleeve is uncovered to permit the sample fixed to the sample stage to be observed.

Patent Document 2 discloses a sample conserving device according to which when preparing a sectioned sample by using a focused ion beam apparatus, in order to suppress to a minimum the time to expose the sample to the atmospheric environment, a main case having a vacuum evacuative space in communication with a vacuum evacuation unit decompressed by a vacuum decompression unit and a mountable/dismountable case having an inner space for having the custody of the sample are provided, so that the sample subject to sectioning can be transferred while conserving the sample in vacuum ambience with ease.

Further, Patent Document 3 discloses a technique concerning a sample transfer container composed of an airtight chamber for accommodating a sample stage, a gate valve provided in communication with the airtight chamber and means for making the position of the sample stage moveable in three-dimensional direction, so that the sample stage can be transferred in vacuum condition between a unit for cutting wiring on a sample and a unit for connecting the wiring.

As will be seen from the foregoing, in any of the disclosed techniques, the sample can be inserted into the electron microscope or the sample preparation apparatus while suppressing to a minimum the time to expose the sample to the atmospheric environment.

SUMMARY OF THE INVENTION

The ambience sample chamber disclosed in Patent Document 1 is detachably attached to a sample inclining unit for electron microscope and a side-entry type sample holder is mountable/dismountable to/from the ambience sample chamber and so, the side-entry type sample holder as a whole can be transferred in vacuum ambience or a desired gas atmosphere. But, in inserting the sample holder from the ambience sample chamber to the sample inclining unit, an insertion rod for insertion of the sample holder is necessary and in order for the side-entry type sample holder to be inserted into the sample inclining unit, the insertion rod needs to have a length equivalent to a length necessary for the side-entry type sample holder to be inserted into the sample inclining unit. Consequently, when transferring the ambience sample chamber or inserting the side-entry type sample holder inside the ambience sample chamber to the sample inclining unit, a vastly spacious site is needed.

Since the side-entry type sample holder disclosed in Non-patent document 1 can be inserted as it is into the electron microscope while covering only a neighborhood of the sample stage with a tip end sleeve, it can be said to be a highly easy to operate sample holder. But, the tip end of the side-entry type sample holder needs to be attached with the tip end sleeve and an O-ring the existing side-entry type sample holder does not incorporate. Hence, the existing side-entry type sample holder per se must be improved. In addition, the disclosed side-entry type sample holder is inclinable in only one axis direction and therefore, when acquiring an electron microscopic image or an electron diffraction pattern of a sample, a desired electron beam incident axis is difficult to set.

In the sample conserving unit disclosed in Patent Document 2, however, it is not presupposed that the sectioned sample prepared by the focused ion bean apparatus is mounted to the side-entry type sample holder. Therefore, in order to mount the sample prepared by the focused ion beam apparatus to the side-entry type sample holder from the sample conserving unit, the sample must once be taken out of the sample conserving unit and is inevitably exposed to the atmospheric environment.

The sample transfer container of Patent Document 3 can transfer the sample between apparatuses while minimizing the time to expose the sample to the atmospheric environment but like Patent Document 1, the insertion rod having the length equivalent to the length through which the side-entry type sample holder is inserted into the sample inclining unit is necessary. Therefore, in transferring the ambience sample chamber and inserting the side-entry type sample holder inside the ambience sample chamber to the sample inclining unit, a vast spacious site is needed.

Accordingly, an object of the present invention is to provide a sample transfer device which can insert a sample to be observed and analyzed under irradiation of a charged particle beam into a charged particle apparatus while suppressing to a minimum the time to expose the sample to the atmospheric environment. Especially, it is an object of the invention to provide a device which can enable working to proceed even when the charged particle beam apparatus has a limited area for working in its neighborhood and a space made room for mounting the sample stage to the side-entry type sample holder is narrow.

To accomplish the above objects, a sample transfer device for transferring a sample to be observed and analyzed under irradiation of a charged particle beam according to the present invention comprises an expansible hollow member capable of accommodating a sample holder mounted with a sample therein, a fixing member for fixing the sample holder within the expansible hollow member and a sealing member communicating with the interior of the expansible hollow member and adapted to open/close an opening through which the sample holder passes.

A sample transfer method for transferring a sample to a charged particle beam apparatus according to the present invention comprises the steps of inserting to a globe box a sample transfer device having an expansible hollow member capable of accommodating a sample holder mounted with a sample therein, a fixing member for fixing the sample holder within the expansible hollow member and a sealing member communicating with the interior of the expansible hollow member and adapted to open/close an opening through which the sample holder passes, mounting the sample to the sample holder within the globe box, fixing the sample holder within the expansible hollow member of the sample transfer device, closing the opening by means of the sealing member, and transferring the sample holder to the charged particle beam apparatus.

According to the sample transfer device of the invention, a side-entry type sample holder used for a charged particle beam apparatus such as a transmission electron microscope, a scanning transmission electron microscope and a focused ion beam apparatus can be transferred in vacuum or a desired gas atmosphere and consequently, the time to expose the sample to the atmospheric environment during transfer thereof can be suppressed to a minimum, thus suppressing the sample from being oxidized or changed in quality. By making deformable the expansible hollow member in which the side-entry type sample holder is accommodated, a sample transfer device can be provided which can mount the sample in a narrow space or reduce the size of the whole apparatus during sample transfer. Further, a sample transfer device can be provided in which an existing side-entry type sample holder can be used as it is.

Other objects, features and advantages of the invention will become apparent from the following description of the embodiments of the invention taken in conjunction with the accompanying drawings.

BRIEF DESCRIPTION OF THE DRAWINGS

FIG. 10 is a flowchart showing the procedures of using the sample transfer device of the invention.

DESCRIPTION OF EMBODIMENTS OF THE INVENTION

Figure 1:
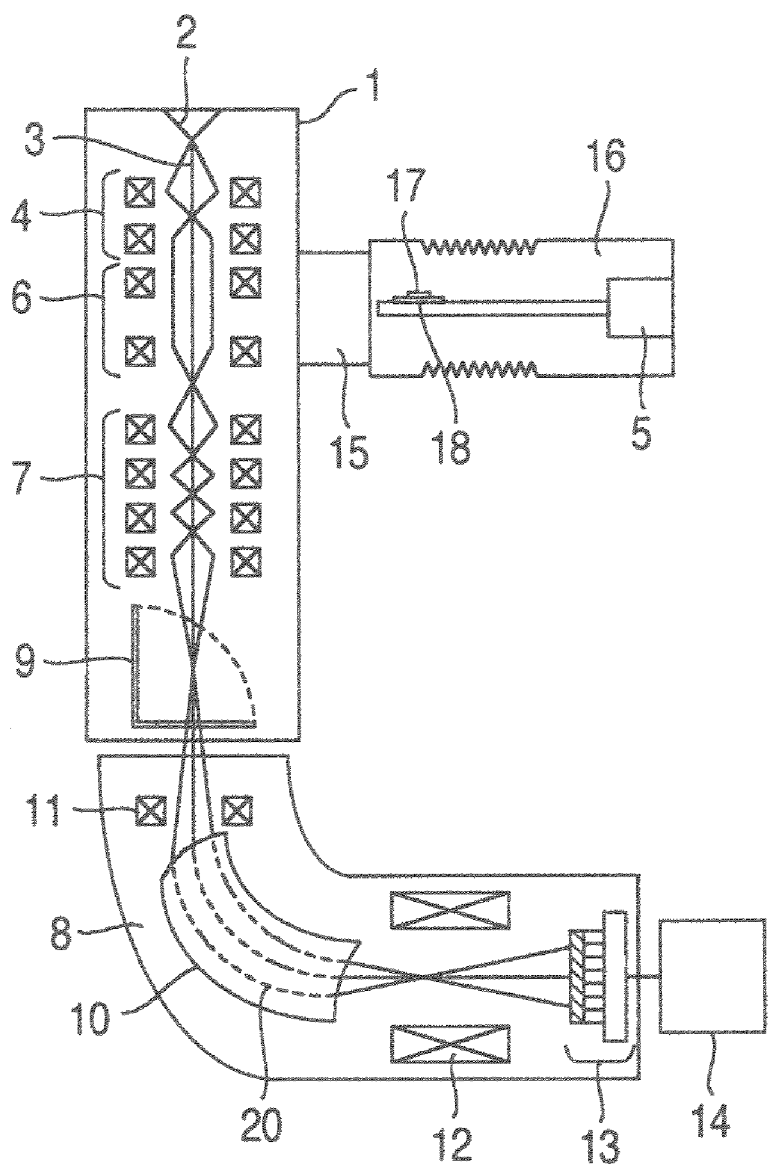
FIG. 1 is a diagram schematically illustrating an example of a transmission electron microscope with an electron spectrometer.

Embodiments of the present invention will now be described with reference to the accompanying drawings.

Throughout all drawings for explaining the embodiments, identical members are designated by identical reference numerals in principle and their reiterative description will be omitted.

Referring first to FIG. 1, an example of a status in which a sample transfer device according to the present invention is attached to a transmission electron microscope with an electron spectrometer according to an embodiment of the invention is illustrated schematically.

In FIG. 1, the transmission electron microscope with electron spectrometer into which a side-entry type sample holder 5 is inserted comprises a transmission electron microscope 1, an electron spectrometer 8 and an image display unit 14. The transmission electron microscope 1 includes an electron source 2 for emitting an electron beam 3, a condenser lens 4, an objective lens 6, an image-forming lens system 7 and a phosphor plate 9 and a tip end portion of the side-entry type sample holder 5 mounted with a sample 17 fixed to a sample stage 18 is inserted into a space between upper and lower magnetic pole pieces of the objective lens 6.

The electron spectrometer 8 includes a magnetic field selector 10, a drift tube 20, multi-pole lenses 11 and 12 and a two-dimensional detector 13 to ensure that a spectral analysis and a two-dimensional element analysis based on electron energy loss spectroscopy can be carried out.

In the transmission electron microscope with electron spectrometer shown in FIG. 1, the electron beam 2 emitted from the electron source 2 passes through the condenser lens 4 and is irradiated on the sample 17 mounted on the sample stage 18. An electron beam 3 having transmitted through the sample 17 passes through the objective lens 6 and the image-forming lens system 7 constituted by a plurality of lenses and when the phosphor plate 9 is opened, the electron beam 3 kept intact enters the electron spectrometer 8. The electron beam 3 having entered the electron spectrometer 8 passes through the multi-pole lenses 11 and 12 used for focusing, enlargement/reduction, aberration correction or the like of electron energy loss spectrum, transmission electron microscopic image and energy selection image through the magnetic field selector 10 capable of performing spectroscopy in accordance with energy amounts the electron beam 3 has and subsequently, it is picked up in the form of a transmission electron microscopic image, a two-dimensional element analysis image and a spectral image by means of the two-dimensional detector 13 such as a CCD camera and thereafter, displayed on the image display unit 14.

It will be appreciated that the construction of transmission electron microscope 1 and the configuration of electron spectrometer 8 are not limited to the above ones and for example, the electron spectrometer 8 may be arranged inside the transmission electron microscope 1. Even when the electron spectrometer 8 is not attached, the transmission electron microscope 1 can observe a transmission microscopic image. In this case, the two-dimensional detector 13 can be arranged directly below the phosphor plate 9 of transmission electron microscope 1. An analyzing unit to be attached to the transmission electron microscope 1 is not limited to the electron spectrometer 8 and for example, an energy dispersion type X-ray detector may be attached.

The side-entry type sample holder 5 is mounted with the sample 17 fixed to the sample stage 18. In transferring the side-entry type sample holder 5 in the atmospheric environment, it is disposed in a sample transfer device 16. The interior ambience of sample transfer device 16 can be exchanged with either vacuum or a desired gas atmosphere and is not exposed to the atmospheric environment.

Figure 2:
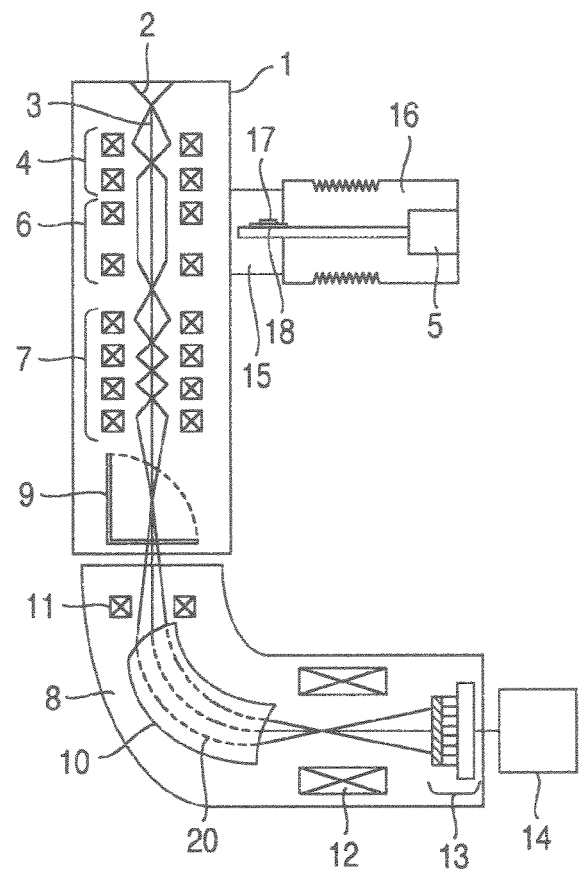
FIG. 2 is a diagram similar to FIG. 1 which is useful in explaining transfer of a sample.

When inserting the side-entry type sample holder 5 into the transmission electron microscope 1 from the sample transfer device 16, the sample transfer device 16 is first fixed to a sample inclining unit 15 of transmission electron microscope. Thereafter, the sample transfer device 16 is shrunk as shown in FIG. 2, so that the side-entry type sample holder 5 is inserted into the sample inclining unit 15 and fixed thereto. After the side-entry type sample holder 5 has been fixed, the sample transfer device 16 can be detached from the sample inclining unit 15.

Figure 3:
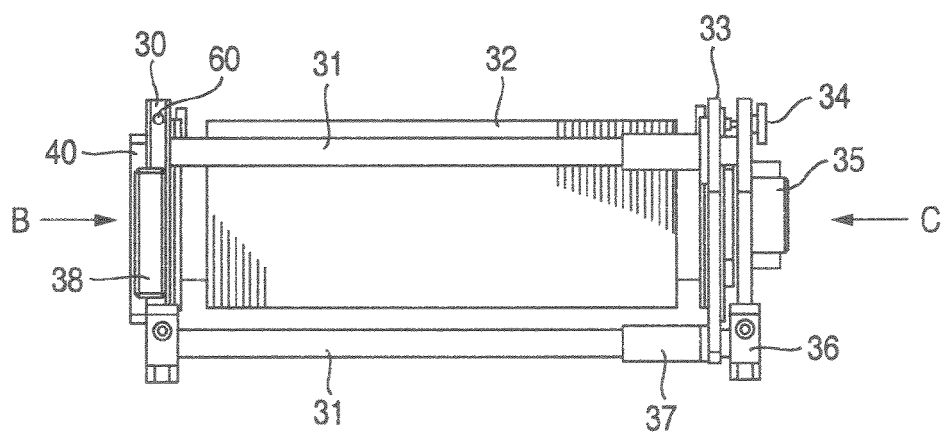
FIG. 3 is a diagram schematically illustrating the construction of an example of a sample transfer device according to the invention.

Turning to FIG. 3, an example of the sample transfer device 16 for transferring the side-entry type sample holder according to an embodiment of the invention is illustrated schematically in side view form as seen in a direction orthogonal to the electron beam 2.

The sample transfer device 16 is constituted by a front flange 30, a back seal plate 33, a bellows 32, guide rods 31, a stopper screw 34, a gate valve 38 and a gate flange 40. The bellows 32 is arranged between front flange 30 and back seal plate 33 and inside the bellows 32, the side-entry type sample holder 5 is arranged. The side-entry type sample holder 5 is fixed to the back seal plate 33. In order to prevent the side-entry type sample holder 5 and bellows 32 from moving during transfer of the sample transfer device 16, the back seal plate 33 is fixed by means of the stopper screw 34. As long as the side entry type sample holder 5 is fixed inside the bellows 32, it may be fixed to a different fixing member.

After being transferred to the sample inclining unit 15, the sample transfer device 16 is held fixedly with the help of the front flange 30 and sample inclining unit 15. After the sample transfer device 16 has been fixed, the gate valve 38 inside the front flange is opened, permitting the side-entry type sample holder 5 to be inserted.

The interior of bellows 32 is hermetically sealed by means of the front flange 30 and an O-ring provided for the back seal plate 33. The interior of bellows 32 can be evacuated to vacuum or the interior ambience can be exchanged with a desired gas atmosphere through the medium of an evacuation hole 60 formed in the front flange 30.

The guide rods 31 extend between front flange 30 and back seal plate 33 and the bellows 32 integral with the back seal plate 33 is shrinkable along the guide rods 31. Since the guide rods 31 extend through guide hole members 37 provided for the back seal plate 33, the side-entry type sample holder 5 can move linearly along the guide rods 31. The guide rods 31 are not limited in number but for accurate linear movement of the side-entry type sample holder 5, a plurality of guide rods may preferably be provided.

In the present embodiment, the bellows 32 made of Teflon (registered trade name) is used in the sample transfer device 16 but any shrinkable material may be used, provided that the material is shrinkable to such an extent that when inserting the side-entry type sample holder 5, the material can be so deformed as to ensure that the side-entry type sample holder 5 can be inserted into the sample inclining unit 15 and during transfer of the side-entry type sample holder, the bellows 32 can maintain vacuum or the gas atmosphere.

Figure 4:
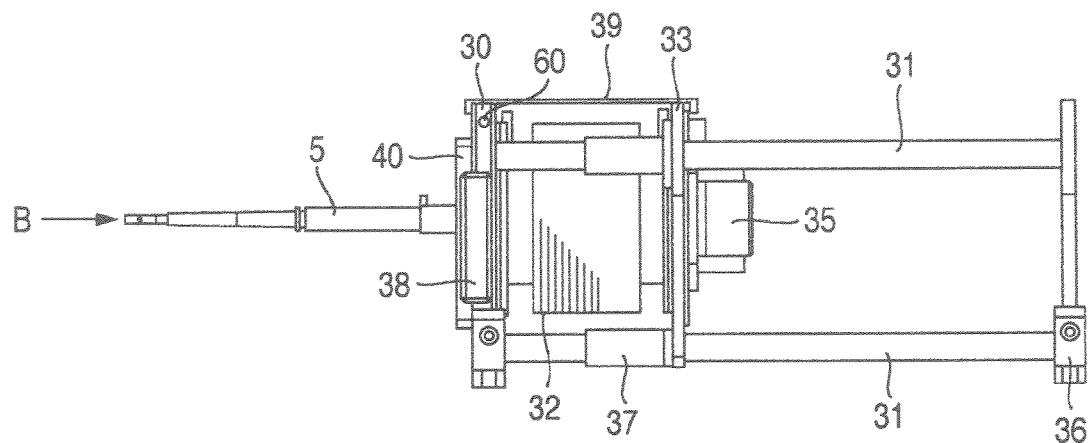
FIG. 4 is a diagram similar to FIG. 3 which is useful in explaining operation of the sample transfer device.

As the side-entry type sample holder 5 is moved linearly until its tip end portion juts out of the sample transfer device 16, that is, when the sample holder tip end portion is inserted into the sample inclining unit 15, the sample transfer device is in positional condition as shown in FIG. 4.

Figure 5:
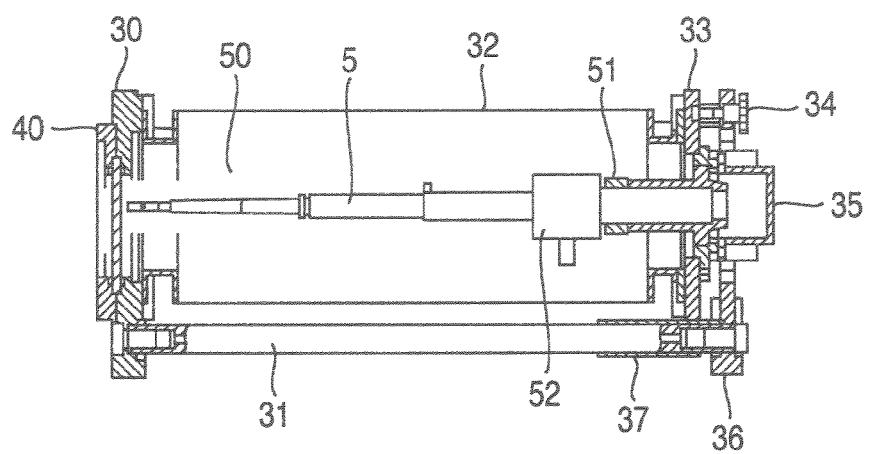
FIG. 5 is a longitudinal sectional diagram schematically illustrating the example of sample transfer device according to the invention.

Another example of the sample transfer device of the invention is illustrated schematically in FIG. 5 in longitudinal sectional form. Illustrated in the figure is a status in which the side-entry type sample holder 5 is held in a sample hold space 50 inside the bellows 32. The side-entry type sample holder 5 is fixed to the back seal plate 33 by means of a holder support member 51. A space between the side-entry type sample holder 5 and the holder support member 51 is hermetically sealed by means of an O-ring.

A side-entry type sample holder back portion 52 is variously shaped depending upon different types of existing sample holders and so, to meet the shapes of the existing sample holders, the shape of the holder support member 51 may be changed. Further, to keep highly accurate vacuum evacuation and exchange of gas atmosphere, a back cover 35 is additionally provided. The back cover 35 is not always necessary.

Figure 6:
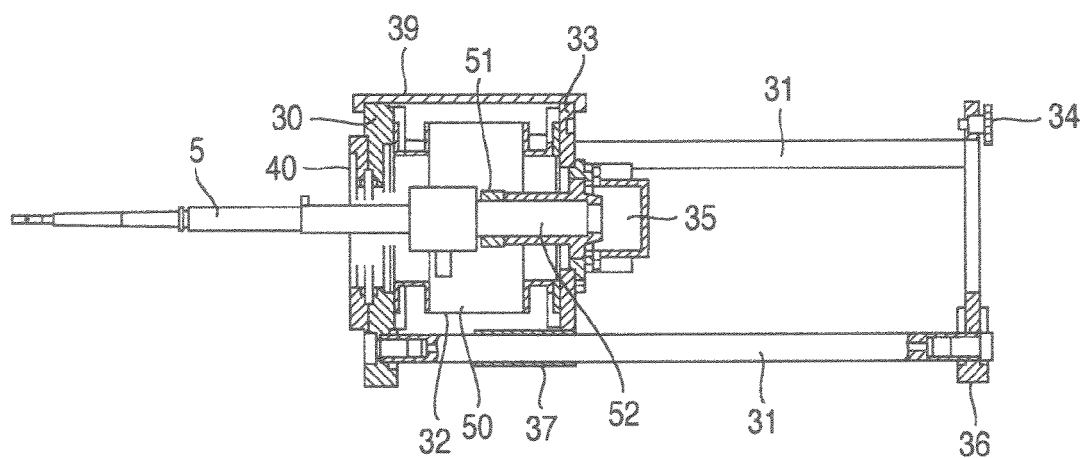
FIG. 6 is a diagram similar to FIG. 5 which is useful in explaining operation of the sample transfer device.

In the case of the sample transfer device exemplified as above, the tip end portion of side-entry type sample holder 5 is inserted into the sample inclining unit 15 as shown in FIG. 6. When inserting the side-entry type sample holder 5, a bellows fixing tool 39 may be used to prevent the bellows 32 from returning toward the back flange 36.

Figure 7:
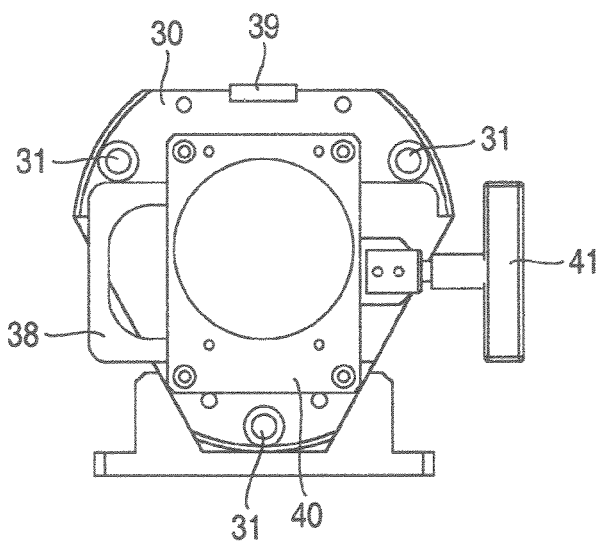
FIG. 7 is a diagram showing a front of the example of the sample transfer device (as viewed in B direction in FIG. 3).
Figure 8:
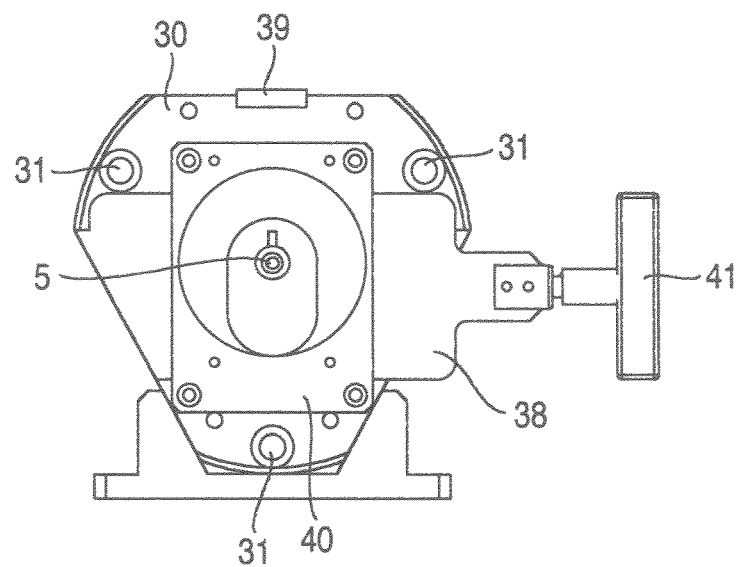
FIG. 8 is a diagram similar to FIG. 7 (as viewed in B direction in FIG. 4).

Illustrated in FIGS. 7 and 8 are front views of the sample transfer device 16 as seen at the tip end portion of the side-entry type sample holder in B direction in FIG. 3 and B direction in FIG. 4, respectively. More particularly, a status in which the gate valve 38 of sample transfer device is closed is shown in FIG. 7 and a status in which the gate valve 38 of sample transfer device is opened is shown in FIG. 8. The gate valve 38 is interposed between the front flange 30 and the gate flange 40.

After the sample transfer device 16 has been fixed to the sample inclining unit 15, the gate valve 38 is opened by means of a handle 41 for gate valve, making the side-entry type sample holder ready for insertion to the interior of the sample inclining unit 15. This method for opening/closing the gate valve 38 is not limitative.

Figure 9:
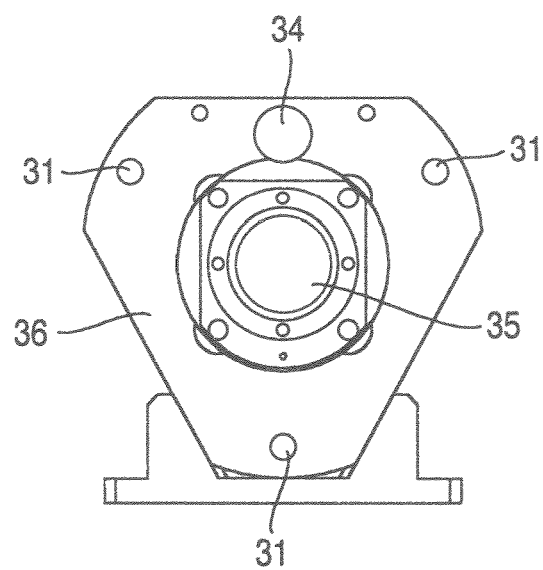
FIG. 9 is a diagram showing a back of the example of the sample transfer device (as viewed in C direction in FIG. 3).

In FIG. 9, the sample transfer device 16 is illustrated as viewed from the back portion of side-entry type sample holder 5 in C direction in FIG. 3, showing a status in which the back cover 35 is attached to the back seal plate 33.

As described previously, the back flange 36 and back seal plate 33 are put together by means of the stop screw 34. Also, the guide rods 31 are fixed to the back flange 36.

Turning now to FIG. 10, a prepared sample 17 in the globe box and ready for observation and analysis with the transmission electron microscope is transferred and inserted into the transmission electron microscope 1 by using the sample transfer device 16 in accordance with procedures indicated in a flowchart shown in the figure. It will be appreciated that the internal ambience of globe box is exchanged with argon gas.

Firstly, the side-entry type sample holder 5 is mounted in the sample transfer device 16 in the atmospheric environment. Subsequently, the sample transfer device 16 mounted with the side-entry type sample holder 5 and having its gate valve 38 opened is inserted into a pre-evacuation chamber attached to the globe box laterally thereof and the interior of sample transfer device 16 is vacuum evacuated (S101 to S103).

Upon insertion into the pre-evacuation chamber, the side-entry type sample holder 5 and sample transfer device 16 may be inserted individually separately.

Next, the sample transfer device 16 is inserted into the globe box and the bellows 32 is shrunk to jut the tip end portion of side-entry type sample holder 5 out of the sample transfer device 16 (S104 to S105). Thereafter, the sample 17 to be observed and analyzed with the transmission electron microscope 1 is mounted to the tip end portion of side-entry type sample holder 5 (S106). The sample 17 has been fixed in advance to the sample stage 18 within the globe box.

Then, the bellows 32 is expanded and the side-entry type sample holder 5 mounted with the sample 17 is stored inside the bellows 32. Subsequently, the gate valve 38 is closed (S106 to S107).

The sample transfer device 16 is taken out of the globe box, transferred as it is and fixed to the sample inclining unit 15 of transmission electron microscope 1. Thereafter, the gate valve 38 of sample transfer device 16 is opened and the side-entry type sample holder 5 is inserted into the sample inclining unit 15. After completion of insertion of the sample holder, the sample transfer device 16 is detached (S108 to S110).

In the above procedures, after completion of the insertion of sample holder, the sample transfer device 16 is detached but especially when no fault takes place in observation and analysis with the transmission electron microscope 1, the sample transfer device may not be detached.

Figure 11A:
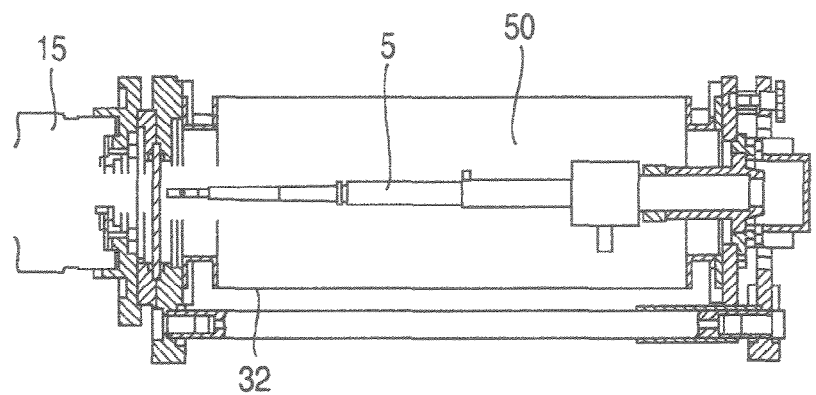
FIGS. 11A to 11C are diagrams for explaining operation of the sample transfer device according to an embodiment of the invention.
Figure 11B:
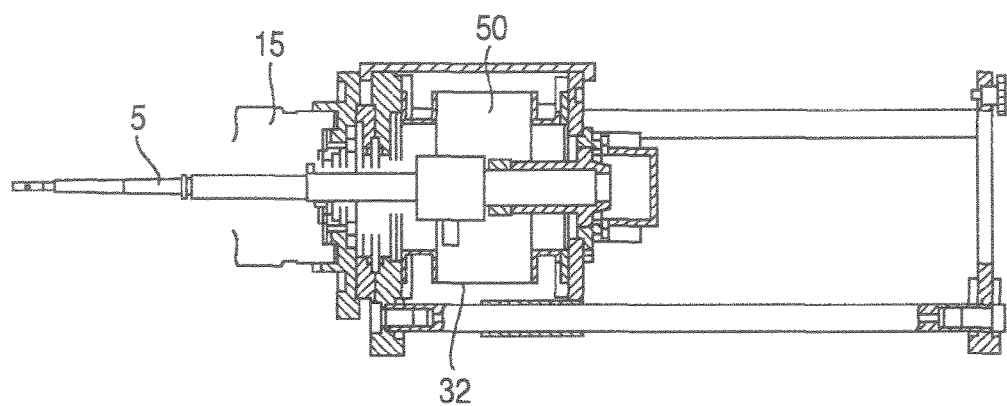
Figure 11C:
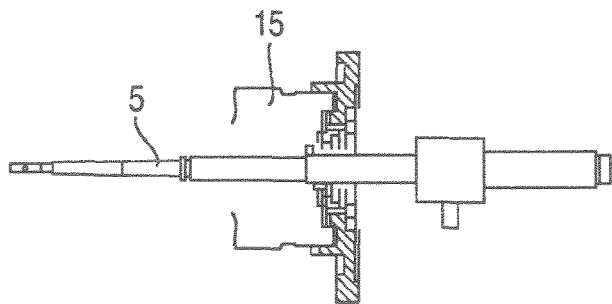

Referring now to FIGS. 11A to 11C, operation when the sample transfer device 16 is fixed to the sample inclining unit 15 and the side-entry type sample holder is inserted will be explained. FIG. 11A is for explaining a status immediately after the sample transfer device 16 is fixedly attached to the sample inclining unit 15. Then, as shown in FIG. 11B, the side-entry type sample holder 5 is inserted into the sample inclining unit 15 from the sample transfer device 16. After the side-entry type sample holder 5 has been inserted into the sample inclining unit 15, the sample transfer device 16 can be detached as shown in FIG. 11C.

If a transmission electron microscopic sample has been prepared with the focused ion beam apparatus, the sample transfer device 16 may first be mounted to a sample inclining unit of the focused ion beam apparatus, the sample holder may then be stored in the sample transfer device and thereafter the gate valve may be closed, followed by transfer of the sample transfer device in the atmospheric environment. Upon storage of the sample holder, the interior ambience of bellows 32, that is, a sample holding space 50 may be vacuum evacuated or exchanged with a gas atmosphere.

The foregoing description has been given by way of example as applied to the transmission electron microscope having an electron spectrometer but the present invention is not limited to the above application and is applicable to all apparatuses in which the side-entry scheme for inserting a sample from the side of a charged particle beam apparatus proper, that is, the side-entry type sample holder is adopted.

Enumerated as the charged particle beam apparatus adopting the side-entry type sample holder for inserting the sample from the side of the apparatus proper are, for example, the transmission electron microscope, scanning transmission electron microscope, scanning electron microscope and focused ion beam apparatus.

The sample transfer device of the invention has been described by way of the side-entry type sample holder 5 but the sample holder mountable in the sample transfer device 16 is not limited thereto.

Figure 12A:
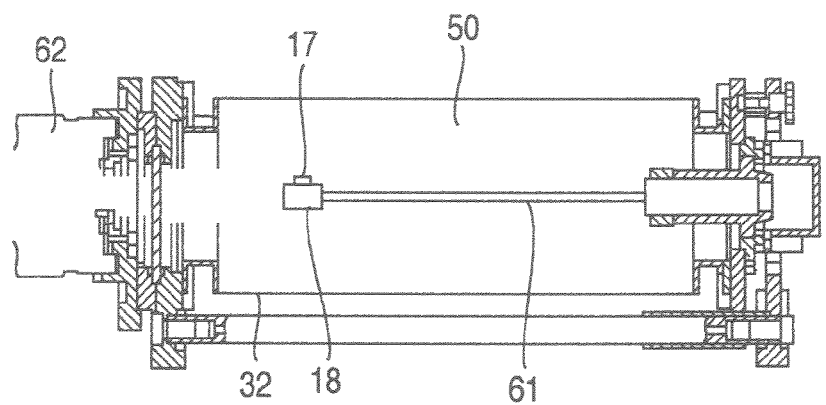
FIGS. 12A and 12B are diagrams for explaining operation of the sample transfer device according to another embodiment of the invention.
Figure 12B:
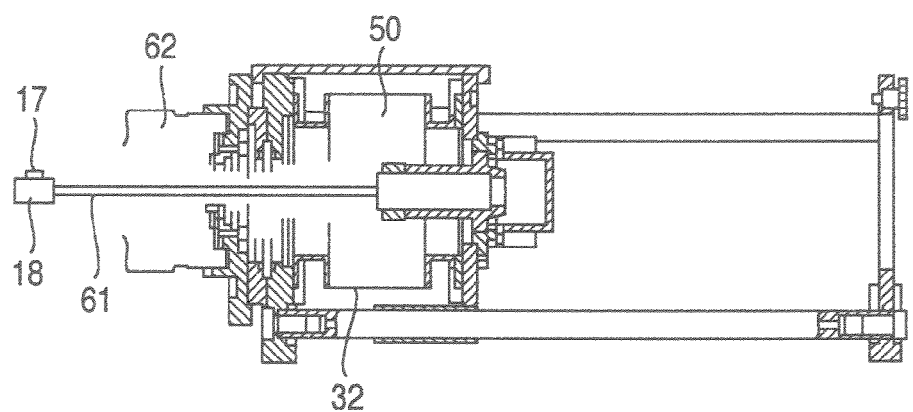

In an example of the sample transfer device of the present invention as shown in FIGS. 12A and 12B, a sample holder of the type other than the side-entry type sample holder is transferred. In a sample holding space 50 of sample transfer device 16, a sample stage 18 and a sample 17 are mounted to the tip end portion of an inserting rod 61 as shown in FIG. 12A.

The sample transfer device 16 is fixed to a pre-evacuation chamber 62 of a charged particle beam apparatus and thereafter, as shown in FIG. 12B, a bellows 32 is shrunk to insert the sample 17 into the pre-evacuation chamber 62. According to the present embodiment, insertion of a top-entry type sample holder of transmission electron microscope 1 is possible and besides, in the scanning electron microscope and focused ion beam apparatus, a sample of large size such as for example a silicon wafer can also be inserted.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A sample transfer device for transferring a sample to be observed and analyzed by irradiating a charged particle beam by a charged particle beam apparatus, comprising:
    an expansible hollow member capable of accommodating a sample holder mounting the sample;
    a fixing member for fixing said sample holder within said expansible hollow member; and
    a sealing member communicating with the interior of said expansible hollow member to open/close an opening through which said sample holder passes,
    wherein said sample holder is attached to said charged particle beam apparatus through said opening by shrinking said expansible hollow member.

2. A sample transfer device according to claim 1, wherein said sealing member is a gate valve.

3. A sample transfer device according to claim 1, wherein said sealing member and said fixing member are coupled to each other by means of guide rods and said fixing member is movable toward said sealing member along said guide rods.

4. A sample transfer device according to claim 1, wherein said expansible hollow member is a bellows.

5. A sample transfer device according to claim 1, wherein said sample holder is a side-entry type sample holder used for the charged particle beam apparatus.

6. A sample transfer device according to claim 1, further comprising:
    an opening which communicates with the interior of said expansible hollow member to permit vacuum evacuation and/or gas introduction.

7. A sample transfer device according to claim 1, wherein said fixing member can removably mount said sample holder.

8. A sample transfer method for transferring a sample to a charged particle beam apparatus, the method comprising steps of:
    inserting to a globe box a sample transfer device having an expansible hollow member capable of accommodating a sample holder mounting the sample, a fixing member for fixing said sample holder within said expansible hollow member; and a sealing member communicating with the interior of said expansible hollow member to open/close an opening through which said sample holder passes;
    mounting said sample to said sample holder within said globe box;
    fixing said sample holder within the expansible hollow member of said sample transfer device; and
    closing said opening by means of said sealing member so as to transfer said sample holder to said charged particle beams apparatus.

9. A sample transfer method according to claim 8, wherein said sample holder is attached to said charged particle beam apparatus by attaching said sample transfer device to said charged particle beam apparatus, by opening said opening and by shrinking said expansible hollow member.

10. A charged particle beam apparatus comprising:
    a charged particle beam source;
    a conversion lens for converging said charged particle beam;
    an objective lens for focusing said charged particle beam onto sample; and
    a sample transfer device for transferring the sample, the sample transfer device comprising:
        an expansible hollow member capable of accommodating a sample holder mounting the sample;
        a fixing member for fixing said sample holder within said expansible hollow member; and
        a sealing member communicating with the interior of said expansible hollow member to open/close an opening through which said sample holder passes,
        wherein said sample holder is attached to said charged particle beam apparatus through said opening by shrinking said expansible hollow member.

11. A sample transfer device according to claim 10, wherein said sealing member is a gate valve.

12. A sample transfer device according to claim 10, wherein said sealing member and said fixing member are coupled to each other by means of guide rods and said fixing member is movable toward said sealing member along said guide rods.

13. A sample transfer device according to claim 10, wherein said expansible hollow member is a bellows.

14. A sample transfer device according to claim 10, wherein said sample holder is a side-entry type sample holder used for a charged particle beam apparatus.

15. A sample transfer device according to claim 10, further comprising:
    an opening which communicates with the interior of said expansible hollow member to permit vacuum evacuation and/or gas introduction.

16. A sample transfer device according to claim 10, wherein said fixing member can removably mount said sample holder.

* * * * *